United States Patent
Xu et al.

(10) Patent No.: US 9,799,574 B2
(45) Date of Patent: Oct. 24, 2017

(54) GATE INTEGRATED DRIVING CIRCUIT AND A RESTORING METHOD THEREOF, A DISPLAY PANEL AND A DISPLAY APPARATUS

(71) Applicants: BOE Technology Group Co., Ltd., Beijing (CN); Beijing BOE Optoelectronics Technology Co., Ltd., Beijing (CN)

(72) Inventors: Rui Xu, Beijing (CN); Xiaochuan Chen, Beijing (CN); Lei Wang, Beijing (CN); Jing Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/236,637

(22) Filed: Aug. 15, 2016

(65) Prior Publication Data
US 2017/0117196 A1    Apr. 27, 2017

(30) Foreign Application Priority Data
Oct. 21, 2015   (CN) .......................... 2015 1 0688998

(51) Int. Cl.
*H01L 21/00* (2006.01)
*H01L 21/66* (2006.01)
(Continued)

(52) U.S. Cl.
CPC .......... *H01L 22/22* (2013.01); *G02F 1/13306* (2013.01); *G02F 1/136259* (2013.01);
(Continued)

(58) Field of Classification Search
None
See application file for complete search history.

(56) References Cited

U.S. PATENT DOCUMENTS

2007/0171115 A1*  7/2007  Kim ................... G09G 3/3677
                                                  341/155
2008/0017892 A1*  1/2008  Parks .............. H01L 27/14887
                                                  257/223
(Continued)

FOREIGN PATENT DOCUMENTS

CN     103928001 A     7/2014
TW     201442250 A    11/2014

OTHER PUBLICATIONS

First Office Action from Chinese Patent Application No. 201510688998.3, dated May 27, 2017, 8 pages.

*Primary Examiner* — Calvin Choi
(74) *Attorney, Agent, or Firm* — Westman, Champlin & Koehler, P.A.

(57) ABSTRACT

The present disclosure provides a gate integrated driving circuit and a restoring method thereof, a display panel and a display apparatus. The gate integrated driving circuit may comprise a plurality of cascaded shift registers, wherein at least one restoring thin film transistor is provided in each of the cascaded shift registers and the restoring thin film transistor is configured to replace a thin film transistor having a failure in the shift register. When a thin film transistor in the shift register has a failure, the gate integrated driving circuit according to the present disclosure may replace the thin film transistor having the failure to operate. Thus, the restoring thin film transistor can restore the failure of the gate integrated driving circuit, thereby improving the productivity of the gate integrated driving circuit.

19 Claims, 5 Drawing Sheets

(51) Int. Cl.
  *G09G 3/36*      (2006.01)
  *G09G 3/3225*    (2016.01)
  *H01L 51/56*     (2006.01)
  *G02F 1/1362*    (2006.01)
  *G02F 1/133*     (2006.01)
  *G11C 19/28*     (2006.01)

(52) U.S. Cl.
  CPC ......... *G09G 3/3225* (2013.01); *G09G 3/3648* (2013.01); *G11C 19/28* (2013.01); *H01L 51/56* (2013.01); *G02F 2001/136268* (2013.01); *G09G 2300/04* (2013.01); *H01L 2251/568* (2013.01)

(56) References Cited

U.S. PATENT DOCUMENTS

2015/0187320 A1    7/2015  Ren
2016/0035903 A1*   2/2016  Okachi ............ H01L 29/78603
                                                  257/66

* cited by examiner

GATE INTEGRATED DRIVING CIRCUIT AND A RESTORING METHOD THEREOF, A DISPLAY PANEL AND A DISPLAY APPARATUS

CROSS-REFERENCE TO RELATED APPLICATION

This application claims the benefit of Chinese Patent Application No. 201510688998.3, filed on Oct. 21, 2015, in the State Intellectual Property Office of China, the whole disclosure of which is incorporated herein by reference.

TECHNICAL FIELD

The present disclosure relates to the field of display technology, and more particularly, to a gate integrated driving circuit and a restoring method thereof, a display panel and a display apparatus.

BACKGROUND

Currently, the display technology is widely used in televisions, mobile phones and display of public information. A display panel for displaying images becomes various, and can display a variety of images. More and more display panels (e.g., a thin film transistor-Liquid Crystal Display (TFT-LCD) panel, an organic light emitting diode (OLED) display panel and the like) require integrating the gate driving circuit on a glass substrate of the display panel by using a gate integrated driving technology, so as to perform a scanning driving of the display panel, thereby reducing costs in both of material costs and manufacturing process.

FIG. 1 shows a configuration of a gate integrated driving circuit in prior art. Since each of shift registers in the gate integrated driving circuit is constituted of a plurality of thin film transistors (TFT) and capacitors and is shift registered, in practice product manufacture, when a TFT from a certain shift register is damaged (for example, channel sticking is occurred), the shift register will be in an abnormal operation state. According to a principle of a gate driver on array (GOA), the abnormal shift register cannot pull down an output of a previous shift register, and cannot charge a next shift register either. Thus, this will cause the whole gate integrated driving circuit to be abnormal. If the channel sticking is occurred between pixels, the pixels may turn to a dark dot or a bright dot according to a display mode, thereby causing the display panel to be in an abnormal operation. Furthermore, an electrostatic breakdown may occur in the channels of the TFT device due to foreign matters such as a dust particle, thereby causing the display panel to be abnormal.

Therefore, the present disclosure is directed to effectively restore a gate integrated driving circuit which is in an abnormal state.

SUMMARY

Embodiments of the present disclosure is to provide a gate integrated driving circuit and a restoring method thereof, a display panel and a display apparatus, which can restore the abnormal gate integrated driving circuit and improve the productivity.

Therefore, the embodiments of the present disclosure provide a gate integrated driving circuit comprising a plurality of cascaded shift registers, wherein at least one restoring thin film transistor is provided in each shift register, and the restoring thin film transistor is configured to replace a thin film transistor having a failure in the shift register.

In an embodiment, one or more of a gate, a source and a drain of the restoring thin film transistor may have at least one tip structure.

In an embodiment, the source and the drain are in a comb-like structure, and the tip structure of the source and/or the drain may be positioned at an end of a handle of the comb-like structure.

In an embodiment, at least one pair of restoring thin film transistors are provided in each shift register, and tips of the tip structures of the gates of the one pair of restoring thin film transistors may converge into one point, and/or tips of the tip structures of the sources of the one pair of restoring thin film transistors may converge into one point, and/or tips of the tip structures of the drains of the one pair of restoring thin film transistors may converge into one point.

In an embodiment, the restoring thin film transistor may be provided at a middle of the shift register.

In an embodiment, every two neighboring shift registers may be grouped together and share a low level signal line which is positioned between the two neighboring shift registers.

The embodiments of the present disclosure also provide a restoring method of the gate integrated driving circuit according to the above embodiments, comprising:

determining a thin film transistor having a failure in a shift register;

cutting off a connection of the thin film transistor having the failure in the shift register, by using a laser beam; and connecting a restoring thin film transistor which is provided in the shift register to the cut off connection in the shift register, so as to replace the thin film transistor having the failure with the restoring thin film transistor to operate.

In an embodiment, the method may further comprise:

connecting a restoring thin film transistor which is provided in another shift register to the cut off connection in the shift register, so as to replace the thin film transistor having the failure with the restoring thin film transistor to operate, wherein the another shift register is configured to share a low level signal line with the shift register which has the thin film transistor having the failure.

The embodiments of the present disclosure also provide a display panel comprising the gate integrated driving circuit according to the above embodiments.

The embodiments of the present disclosure also provide a display apparatus comprising the display panel according to the above embodiments.

Therefore, the embodiments of the present disclosure provide a gate integrated driving circuit and a restoring method thereof, a display panel and a display apparatus. The gate integrated driving circuit may comprise a plurality of cascaded shift registers, wherein at least one restoring thin film transistor is provided in each of the cascaded shift registers and the restoring thin film transistor is configured to replace a thin film transistor having a failure in the shift register. When a thin film transistor in the shift register has a failure, the gate integrated driving circuit according to the present disclosure may replace the thin film transistor having the failure to operate. Thus, the restoring thin film transistor can restore the failure of the gate integrated driving circuit, thereby improving the productivity of the gate integrated driving circuit.

DETAILED DESCRIPTION

Specific implementations of a gate integrated driving circuit and a restoring method thereof, a display panel and a display apparatus according to embodiments of the present disclosure will be described in detail below in conjunction with accompanying drawings.

Figure 1:
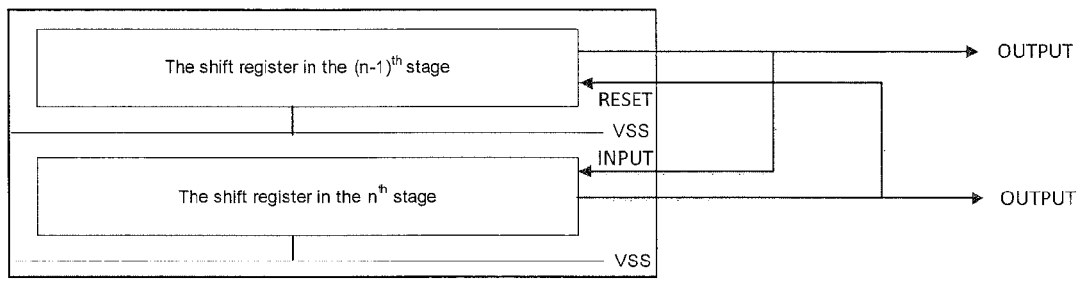
FIG. 1 shows a configuration of a gate integrated driving circuit in prior art.
Figure 2:
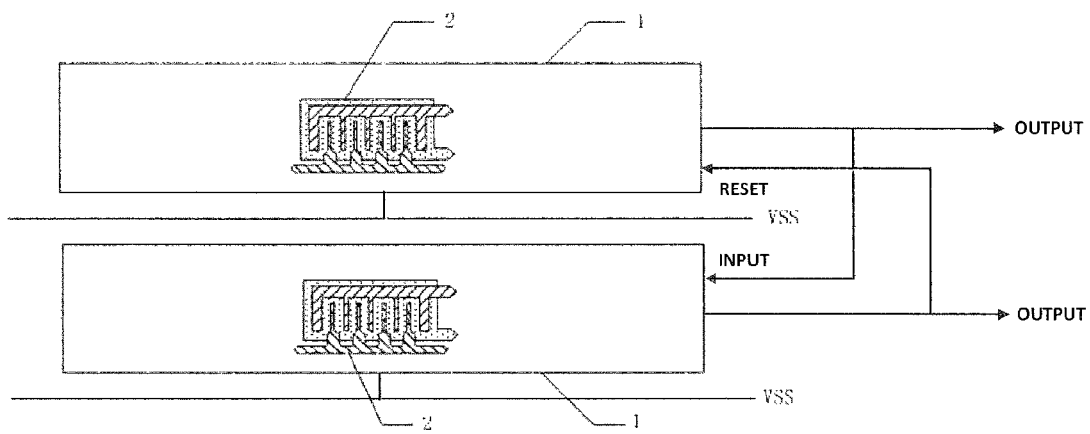
FIG. 2 shows a configuration of a gate integrated driving circuit according to the embodiments of the present disclosure.

As shown in FIG. 2, the gate integrated driving circuit according to the embodiments of the present disclosure may comprise a plurality of cascaded shift registers 1. For clarity and conciseness, FIG. 2 shows two neighboring shift registers 1, however the number of the shift registers is not limited to this.

At least one restoring thin film transistor 2 may be provided in each of the plurality of cascaded shift registers 1. The restoring thin film transistor 2 may be configured to replace a thin film transistor having a failure in the shift register 1.

In the above gate integrated driving circuit, when a thin film transistor in the shift register has a failure, the restoring thin film transistor provided in the gate integrated driving circuit according to the present disclosure may replace the thin film transistor having the failure to operate. Thus, the restoring thin film transistor can restore the failure of the gate integrated driving circuit, thereby improving the productivity of the gate integrated driving circuit.

It should be noted that the shift register are represented by a block in the drawings, and it is only intended to illustrate the present disclosure, and the connection relationships between the two shift registers, and the shift register and low level signal line are illustrative and are not limited to this. When thin film transistors in the shift register are all in a normal operation state, a gate, a source and a drain of the restoring thin film transistor may be floated, i.e. not connected with any device of the shift register.

Figure 3:
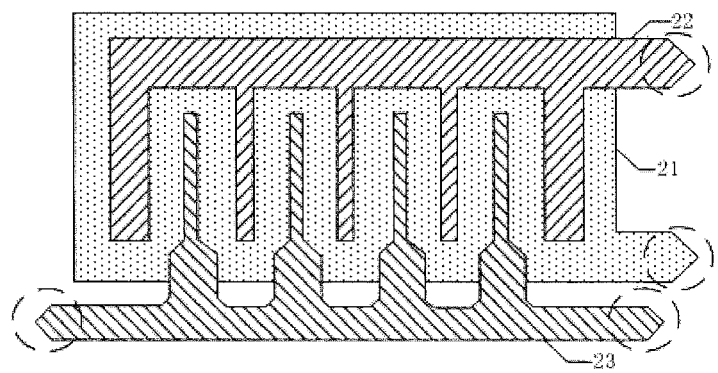
FIG. 3 is a structural diagram of a restoring thin film transistor according to the embodiments of the present disclosure.

In an implementation, when the shift register is in a normal operation state, one or more of the gate, the source and the drain of the restoring thin film transistor may have at least one tip structure, in order to prevent an occurrence of an electrostatic breakdown. FIG. 3 shows a case of each of the gate 21 and the source 22 of the restoring thin film transistor 2 having a tip structure (indicated by a dotted circle) and the drain 23 having two tip structures (indicated by a dotted circle). According to a principle of the tip discharging, the tip structure may be used to keep the restoring thin film transistor from an electrostatic shock. In other words, when the gate integrated driving circuit generates static electricity, the static electricity can be released by the tip structure, so as to keep the gate integrated driving circuit from an electrostatic shock. It should be noted that the total number of the tip structures depends on practice situations, and is not limited to the number disclosed by the drawings of the present disclosure.

Furthermore, in the above gate integrated driving circuit, the source and the drain of the restoring thin film transistor may be in a comb-like structure, and the tip structure of the source and/or the drain may be positioned at an end of a handle of the comb-like structure. As shown in FIG. 3, both the source 22 and the drain 23 of the restoring thin film transistor 2 are in a comb-like structure, and the tip structure of the source 22 and/or the drain 23 may be positioned at the end of a handle of the comb-like structure (indicated by a dotted circle). It should be noted that the detailed structure of the restoring thin film transistor according to the embodiments of the present disclosure can be a structure of any type of a thin film transistor which is suitable for being provided in a shift register. The structure of the restoring thin film transistor may depends on different situations and is not limited to the structure disclosed in the drawings of the present disclosure.

Figure 4:
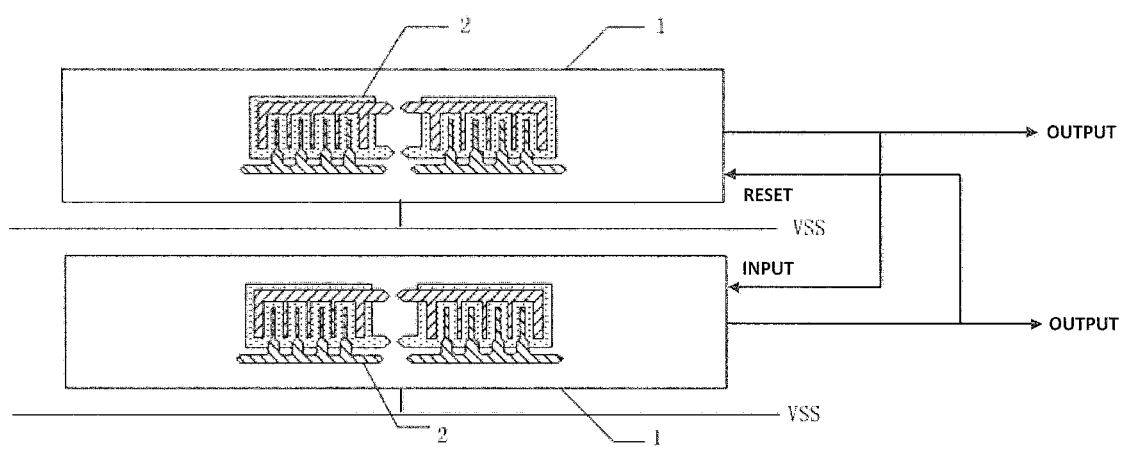
FIG. 4 is a structural diagram of a pair of restoring thin film transistors according to the embodiments of the present disclosure.
Figure 5:
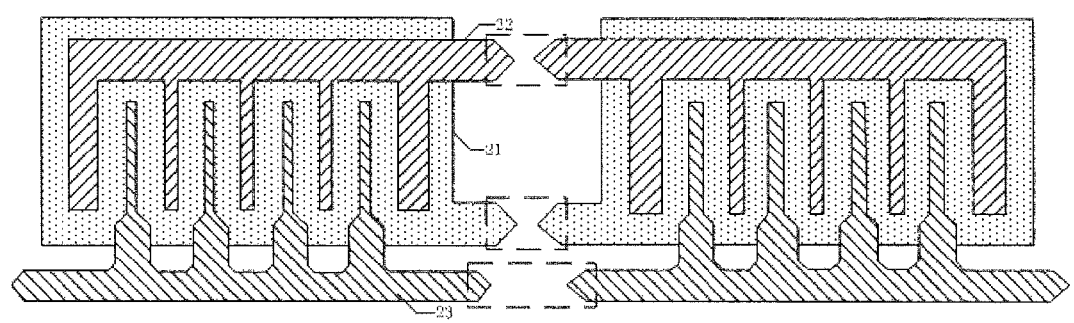
FIG. 5 is a configuration of the gate integrated driving circuit according to the embodiments of the present disclosure.

In an implementation, in order to prevent the occurrence of the electrostatic shock more effectively, preferably at least one pair of the restoring thin film transistors 2 can be provided in each shift register 1, as shown in FIG. 4. Tips of the tip structures of the gates of the one pair of restoring thin film transistors 2 may converge into one point, and/or tips of the tip structures of the sources of the one pair of restoring thin film transistors may converge into one point, and/or tips of the tip structures of the drains of the one pair of restoring thin film transistors may converge into one point. As shown in FIG. 5, tips of the tip structures of the gates 21 of the one pair of restoring thin film transistors converge into one point (indicated by a dotted box), tips of the tip structures of the sources 22 converge into one point (indicated by a dotted box), and tips of the tip structures of the drains 23 may converge into one point (indicated by a dotted box), which can prevent the electrostatic shock effectively.

In an implementation, the restoring thin film transistor may be provided at a middle of the shift register, in order to take a consideration of the failures at both sides of the shift register in the above gate integrated driving circuit. In other words, respective devices in the shift register may be divided into two parts, and the restoring thin film transistor is provided between the two parts.

Figure 6A:
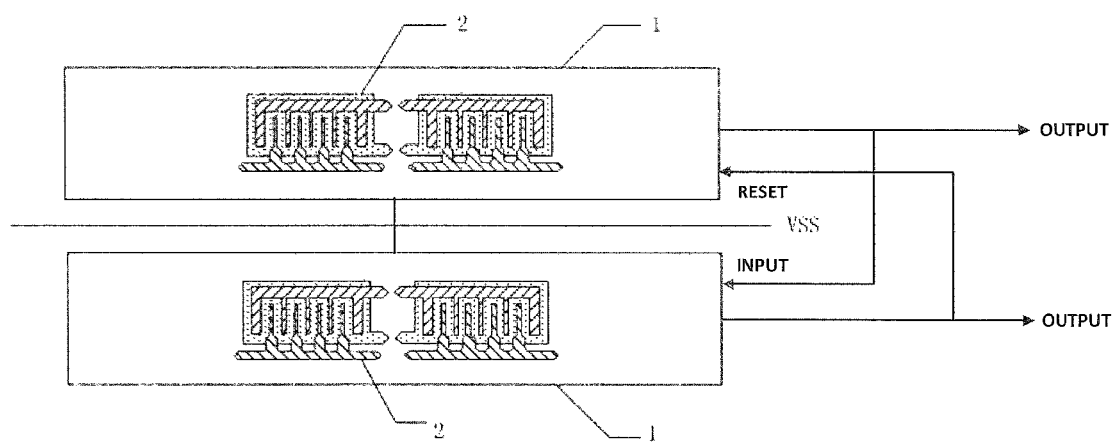
FIG. 6a is a configuration of the gate integrated driving circuit according to the embodiments of the present disclosure.
Figure 6B:
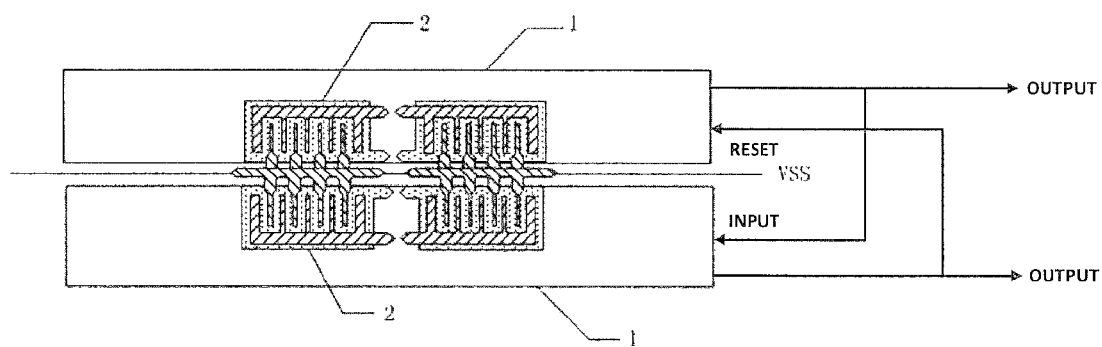
FIG. 6b is a configuration of the gate integrated driving circuit according to the embodiments of the present disclosure.

In an implementation, since the addition of the restoring thin film transistor in the shift register may require a certain space, two neighboring shift registers 1 can be in one group and share one low level signal line (Vss signal line) positioned between the two neighboring shift registers 1, as shown in FIGS. 6a and 6b, so as to save spaces. FIG. 6b shows a case of the drains of the two corresponding restoring thin film transistors in the two neighboring shift registers can be electrically connected, i.e. the two corresponding restoring thin film transistors may share a drain, which can save more space. When a large device in the shift register is damaged, restoring may be performed by using two corresponding restoring thin film transistors which share the same drain.

In an implementation, the gate integrated driving circuit according to the embodiments of the present disclosure may also comprise other structures such as a thin film transistor, a capacitor and other reference voltage signal line. These structures can be implemented in various ways, which is not limited here.

Based on the same inventive concept, the embodiments of the present disclosure further provide a restoring method of the gate integrated driving circuit described above. Since the principle of the method is similar with the principle of the gate integrated driving circuit, implementations of the method may refer to the implementations of the gate integrated driving circuit, thus it will not be descripted in details.

Figure 7A:
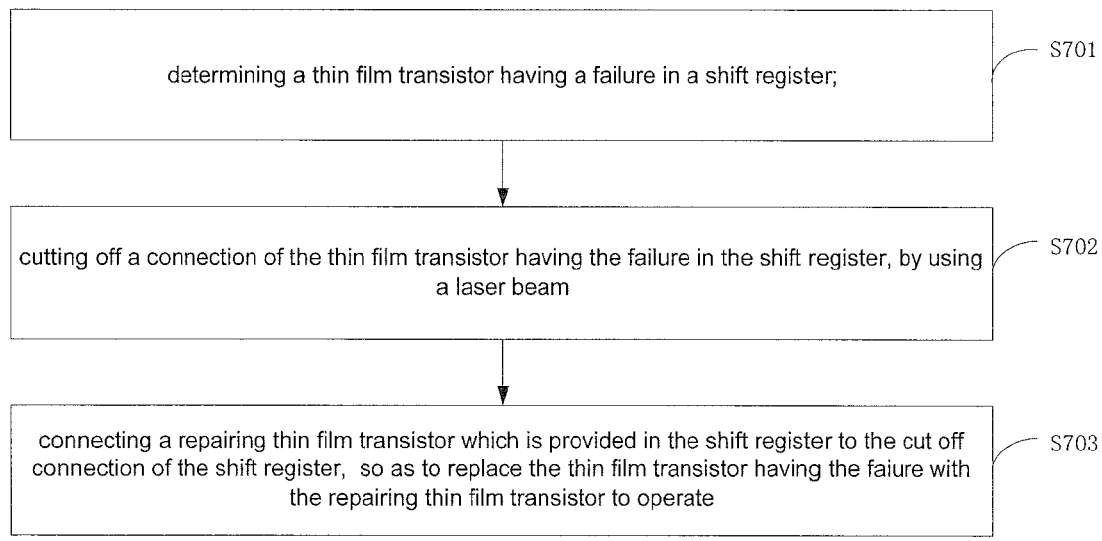
FIG. 7a is a flow chart of a restoring method of a gate integrated driving circuit according to the embodiments of the present disclosure.

As shown in FIG. 7a, in one implementation, a restoring method of the gate integrated driving circuit according to the embodiments of the present disclosure may comprise:

in step S701, determining a thin film transistor having a failure in a shift register;

in step S702, cutting off a connection of the thin film transistor having the failure in the shift register, by using a laser beam; and in step S703, connecting a restoring thin film transistor which is provided in the shift register to the cut off connection of the shift register, so as to replace the thin film transistor having the failure with the restoring thin film transistor to operate.

In the restoring method of the gate integrated driving circuit discussed above, when the thin film transistor of the shift register has a failure, a connection of the thin film transistor having the failure in the shift register is cut off by using a laser beam, and the restoring thin film transistor provided in the shift register is connected to the cut off connection in the shift register, to replace the thin film transistor having the failure to operate. Thus, the restoring thin film transistor can restore the failure of the gate integrated driving circuit, thereby improving the productivity of the gate integrated driving circuit.

It should be noted that in step S703, the restoring thin film transistor provided in the shift register can be connected to the cut off connection in the shift register by using a Tungsten powder deposition method.

Figure 7B:
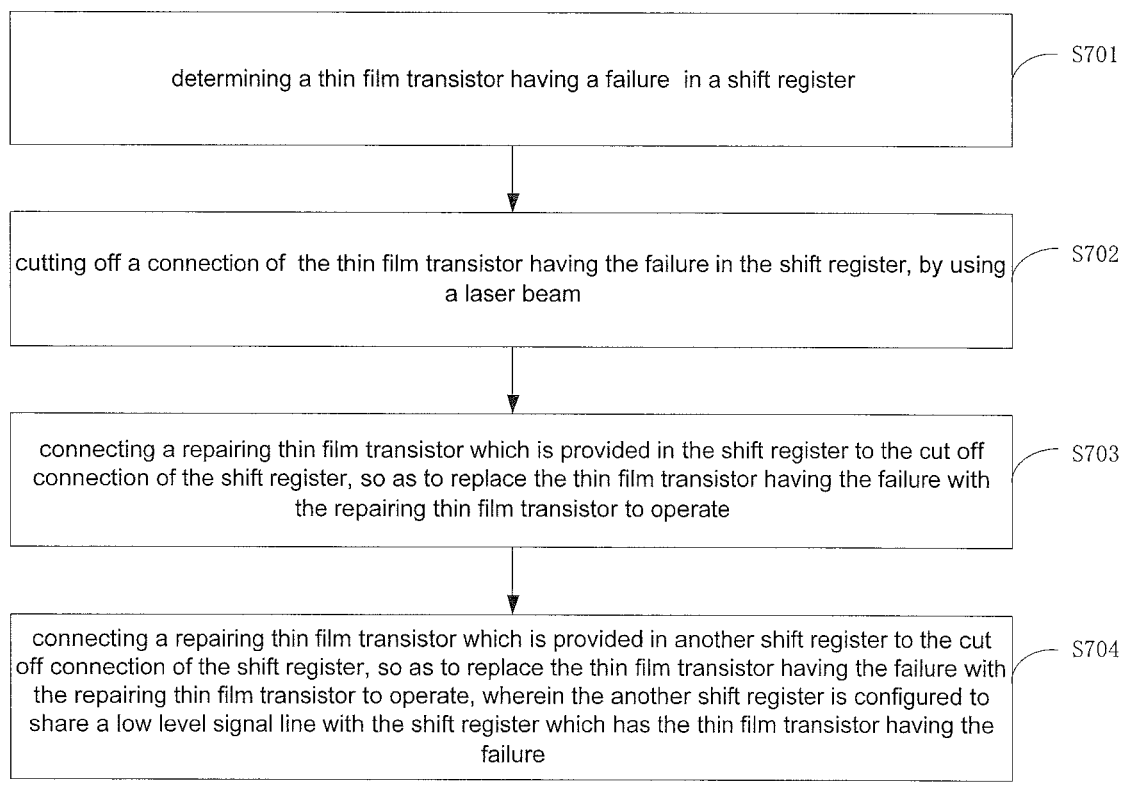
FIG. 7b is a flow chart of a restoring method of a gate integrated driving circuit according to the embodiments of the present disclosure.

As shown in FIG. 7b, in an implementation, the restoring method of the gate integrated driving circuit according to the embodiments of the present disclosure may further comprise:

in step S704, connecting a restoring thin film transistor which is provided in another shift register to the cut off connection of the shift register, so as to replace the thin film transistor having the failure with the restoring thin film transistor to operate, wherein the another shift register is configured to share a low level signal line with the shift register which has the thin film transistor having the failure.

It should be noted that in step S704, the restoring thin film transistor provided in another shift register which share a low level signal line with the shift register which has the thin film transistor having the failure, can be connected to the cut off connection of the shift register by using a Tungsten powder deposition method. The sequence of the step S703 and the step S704 can be interchanged, which is not limited here. Step 704 is suitable for a case of a large device in the shift register being damaged. The drains of the two corresponding restoring thin film transistors in the two neighboring shift registers can be connected together, i.e. the two corresponding thin film transistors can share one drain.

Then, the restoring may be performed by using two corresponding restoring thin film transistors which share the same drain, thereby improving the productivity of a large size product and the economic benefits.

Based on the same inventive concept, the embodiments of the present disclosure further provide a display panel comprising the gate integrated driving circuit discussed above. The display panel may be implemented with a thin film transistor-liquid crystal display panel, an organic light emitting display panel or other types of display panel.

Based on the same inventive concept, the embodiments of the present disclosure further provide a display apparatus comprising the display panel discussed above. The display apparatus may be implemented with any product or part which has a display function, such as a mobile phone, a tablet, a television, a displayer, a laptop, a digital frame, a navigator and the like. Those skilled in the art should understand that the display apparatus may also comprise parts which are necessary for the display apparatus but are not described herein, and those parts should not be considered as a limitation to the present disclosure. Implementations of the display apparatus may refer to the implementations of the gate integrated driving circuit and the display panel, thus it will not be descripted in details.

Therefore, the embodiments of the present disclosure provide a gate integrated driving circuit and a restoring method thereof, a display panel and a display apparatus. The gate integrated driving circuit may comprise a plurality of cascaded shift registers, wherein at least one restoring thin film transistor is provided in each of the cascaded shift registers and the restoring thin film transistor is configured to replace a thin film transistor having a failure in the shift register. When a thin film transistor in the shift register has a failure, the gate integrated driving circuit according to the present disclosure may replace the thin film transistor having the failure to operate. Thus, the restoring thin film transistor can restore the failure of the gate integrated driving circuit, thereby improving the productivity of the gate integrated driving circuit.

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

We claim:

1. A gate integrated driving circuit comprising a plurality of cascaded shift registers,
   wherein at least one restoring thin film transistor is provided in each shift register, and a restoring thin film transistor is configured to replace a thin film transistor having a failure in the shift register containing the restoring thin film transistor,
   wherein at least one of a gate, a source and a drain of the restoring thin film transistor has at least one discharging tip structure.

2. The gate integrated driving circuit of claim 1, wherein the source and the drain are in a comb-like structure, and the tip structure of the source and/or the drain is positioned at an end of a handle of the comb-like structure.

3. The gate integrated driving structure of claim 2, wherein at least one pair of restoring thin film transistors are provided in each shift register, and tips of the tip structures of the gates of the one pair of restoring thin film transistors converge into one point, and/or tips of the tip structures of the sources of the one pair of restoring thin film transistors converge into one point, and/or tips of the tip structures of the drains of the one pair of restoring thin film transistors converge into one point.

4. The gate integrated driving circuit of claim 1, wherein the restoring thin film transistor is provided at a middle of the shift register.

5. The gate integrated driving circuit of claim 3, wherein the at least one pair of restoring thin film transistors are provided at a middle of the shift register.

6. The gate integrated driving circuit of claim 1, wherein every two neighboring shift registers are in one group and share a low level signal line which is positioned between the two neighboring shift registers.

7. The gate integrated driving circuit of claim 2, wherein every two neighboring shift registers are in one group and share a low level signal line which is positioned between the two neighboring shift registers.

8. The gate integrated driving circuit of claim 3, wherein every two neighboring shift registers are in one group and share a low level signal line which is positioned between the two neighboring shift registers.

9. A restoring method of the gate integrated driving circuit of claim 1, comprising:

determining a thin film transistor having a failure in a shift register;

cutting off a connection of the thin film transistor having the failure in the shift register, by using a laser beam; and connecting a restoring thin film transistor which is provided in the shift register to the cut off connection in the shift register, so as to replace the thin film transistor having the failure with the restoring thin film transistor to operate.

10. The method of claim 9, further comprising:

connecting a restoring thin film transistor which is provided in another shift register to the cut off connection in the shift register, so as to replace the thin film transistor having the failure with the restoring thin film transistor to operate, wherein the another shift register is configured to share a low level signal line with the shift register which has the thin film transistor having the failure.

11. A display panel, comprising the gate integrated driving circuit of claim 1.

12. The display panel of claim 11, wherein the source and the drain are in a comb-like structure, and the tip structure of the source and/or the drain is positioned at an end of a handle of the comb-like structure.

13. The display panel of claim 12, wherein at least one pair of restoring thin film transistors are provided in each shift register, and tips of the tip structures of the gates of the one pair of restoring thin film transistors converge into one point, and/or tips of the tip structures of the sources of the one pair of restoring thin film transistors converge into one point, and/or tips of the tip structures of the drains of the one pair of restoring thin film transistors converge into one point.

14. The display panel of claim 11, wherein the restoring thin film transistor is provided at a middle of the shift register.

15. The display panel of claim 13, wherein the at least one pair of restoring thin film transistors are provided at a middle of the shift register.

16. The display panel of claim 11, wherein every two neighboring shift registers are in one group and share a low level signal line which is positioned between the two neighboring shift registers.

17. A display apparatus, comprising the display panel of claim 11.

18. The gate integrated driving circuit of claim 6, wherein the restoring thin film transistor in one of the two neighboring shift registers sharing a low level signal line is configured to replace a thin film transistor having a failure in any one of the two neighboring shift registers.

19. The display panel of claim 16, wherein the restoring thin film transistor in one of the two neighboring shift registers sharing a low level signal line is configured to replace a thin film transistor having a failure in any one of the two neighboring shift registers.

* * * * *